United States Patent
Le et al.

(10) Patent No.: US 11,222,656 B1
(45) Date of Patent: Jan. 11, 2022

(54) METHOD TO REDUCE BASELINE SHIFT FOR A SOT DIFFERENTIAL READER

(71) Applicant: Western Digital Technologies, Inc., San José, CA (US)

(72) Inventors: Quang Le, San Jose, CA (US); Xiaoyong Liu, San Jose, CA (US); Zhigang Bai, Fremont, CA (US); Zhanjie Li, Pleasanton, CA (US); Kuok San Ho, Emerald Hills, CA (US); Hisashi Takano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/029,826

(22) Filed: Sep. 23, 2020

Related U.S. Application Data

(60) Provisional application No. 63/050,016, filed on Jul. 9, 2020.

(51) Int. Cl.
*G11B 5/37* (2006.01)
*G11B 5/23* (2006.01)
*G11B 5/11* (2006.01)

(52) U.S. Cl.
CPC .............. *G11B 5/372* (2013.01); *G11B 5/112* (2013.01); *G11B 5/232* (2013.01)

(58) Field of Classification Search
None
See application file for complete search history.

(56) References Cited

U.S. PATENT DOCUMENTS 7,016,160 B2   3/2006   Mao et al.
10,483,457 B1 *  11/2019  Lee ................... G11C 11/1673
(Continued)

FOREIGN PATENT DOCUMENTS

JP    2021057357 A    4/2021
WO    2019093964 A1   5/2019

OTHER PUBLICATIONS

"BiSb expands the potential of topological insulators for ultra-low-power electronic devices," Tokyo Institute of Technology, Physics & Chemistry, Aug. 1, 2018, 2 pages, <https://phys.org/news/2018-08-bisb-potential-topological-insulators-ultra-low-power.html>.

(Continued)

*Primary Examiner* — William J Klimowicz
(74) *Attorney, Agent, or Firm* — Patterson & Sheridan, LLP; Steven H. Versteeg

(57) ABSTRACT

The present disclosure generally relates to spin-orbital torque (SOT) differential reader designs. The SOT differential reader is a multi-terminal device that comprises a first shield, a first spin hall layer, a first free layer, a gap layer, a second spin hall layer, a second free layer, and a second shield. The gap layer functions as an electrode and is disposed between the first spin hall layer and the second spin hall layer. Electrical lead connections are located about the first spin hall layer, the second spin hall layer, the gap layer, the first shield, and/or the second shield. The electrical lead connections facilitate the flow of current and/or voltage from a negative lead to a positive lead. The positioning of the electrical lead connections and the positioning of the SOT differential layers improves reader resolution without decreasing the shield-to-shield spacing (i.e., read-gap).

20 Claims, 11 Drawing Sheets

(56) References Cited

U.S. PATENT DOCUMENTS

| | | | |
|---|---|---|---|
| 10,490,731 | B2 | 11/2019 | Sasaki et al. |
| 10,559,747 | B1 | 2/2020 | Li et al. |
| 2017/0077392 | A1 | 3/2017 | Han et al. |
| 2018/0106873 | A1 | 4/2018 | Wu et al. |
| 2018/0358543 | A1* | 12/2018 | Le .................. G11B 5/372 |
| 2019/0058113 | A1 | 2/2019 | Ramaswamy et al. |
| 2019/0377037 | A1 | 12/2019 | Wu et al. |
| 2019/0392881 | A1* | 12/2019 | Rakshit ............ H01L 43/08 |
| 2020/0035910 | A1 | 1/2020 | Li et al. |
| 2021/0056988 | A1* | 2/2021 | Chen ................ G11B 5/3932 |

OTHER PUBLICATIONS

Han et al. "Room-Temperature Spin-Orbit Torque Switching Induced by a Topological Insulator," Physical Review Letters, vol. 119, No. 7, Aug. 18, 2017, 15 pages.

Han et al. "Self-Biased Differential Dual Spin Valve Readers for Future Magnetic Recording," IEEE Transactions on Magnetics, vol. 48, No. 5, May 2012, pp. 1770-1776, DOI: 10.1109/TMAG.2011.2169946.

Khang et al. A conductive topological insulator with large spin Hall effect for ultralow power spin-orbit torque switching, Mature Materials, vol. 17, Sep. 2018, pp. 808-813, <https://doi.org/10.1038/s41563-018-0137-y>.

Khang et al. "Giant unidirectional magnetoresistance in topological insulator—ferromagnetic semiconductor heterostructures," Journal of Applied Physics, vol. 126, No. 23, 2019, 25 pages, <https://doi.org/10.1063Z1.5134728>.

Shirakura et al. "Origin of the giant spin Hall effect in BiSb topological insulator," arXiv: Mesoscale and Nanoscale Physics, 2018, 27 pages.

Yuan et al. "Readback Resolution of Differential Dual CPP Spin Valve Reader," IEEE Transactions on Magnetics, vol. 46, No. 6, Jun. 2010, pp. 1667-1670, DOI: 10.1109/TMAG.2010.2045106.

International Search Report and the Written Opinion for International Application No. PCT/US2021/033209 dated Aug. 4, 2021, 9 pages.

* cited by examiner

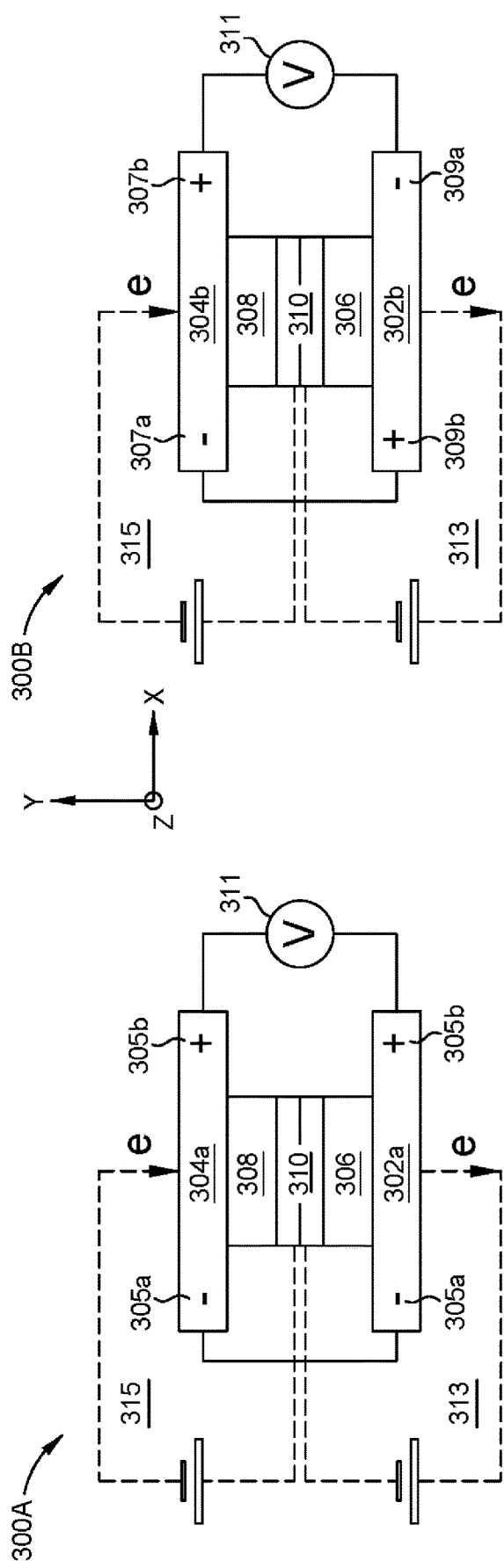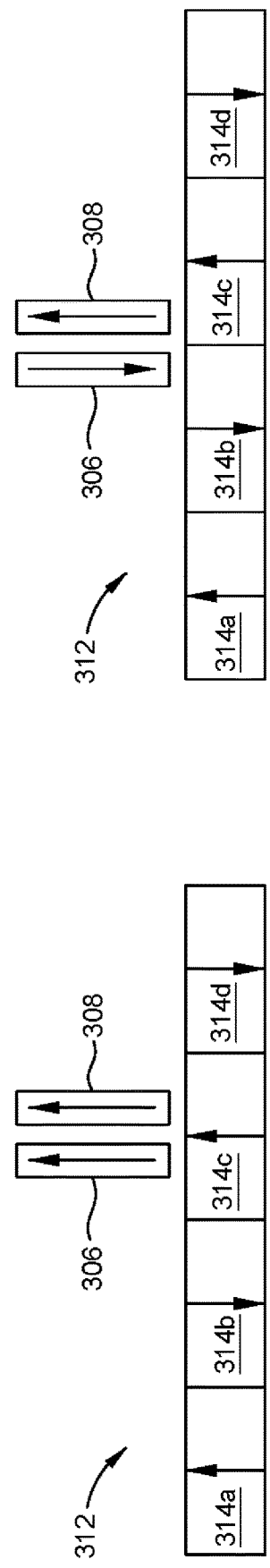
FIG. 3A
FIG. 3B

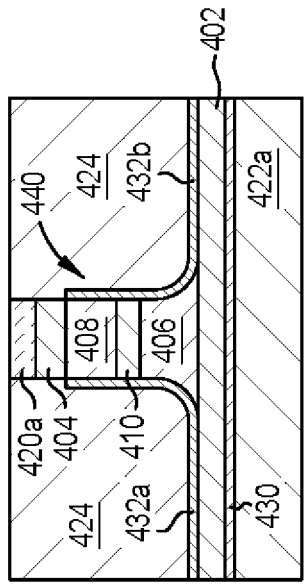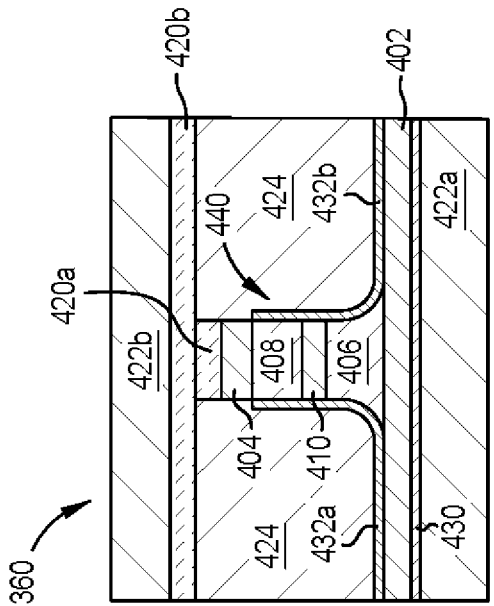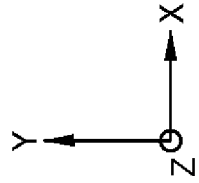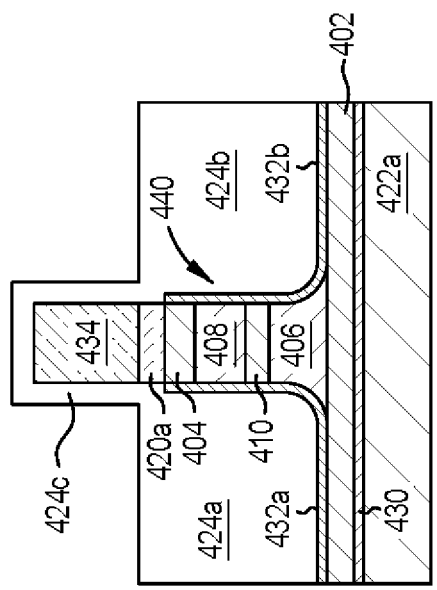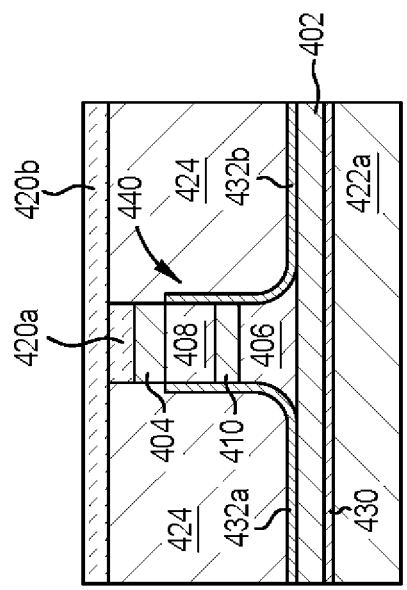

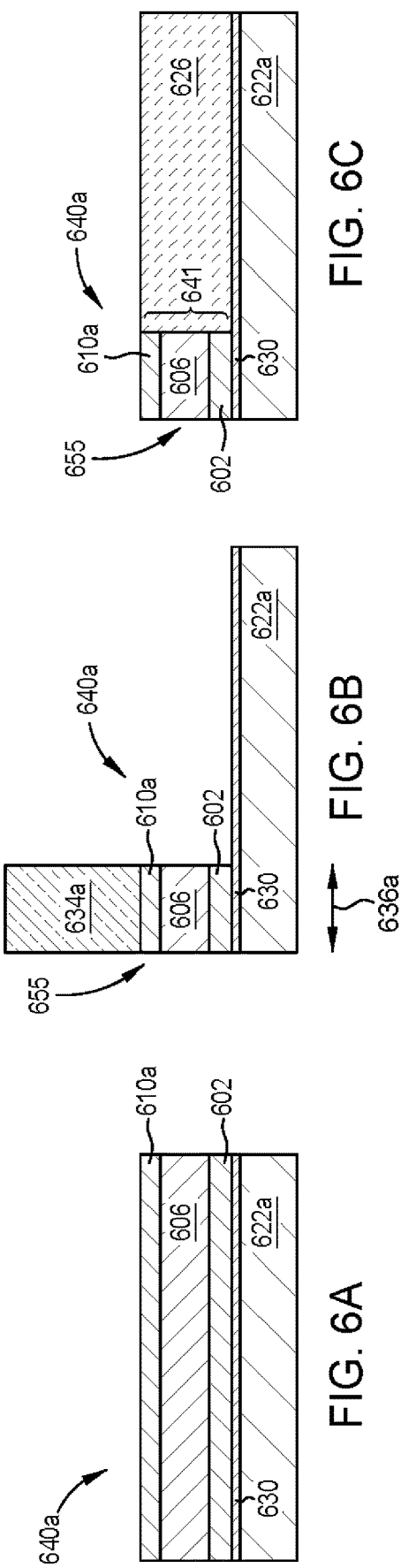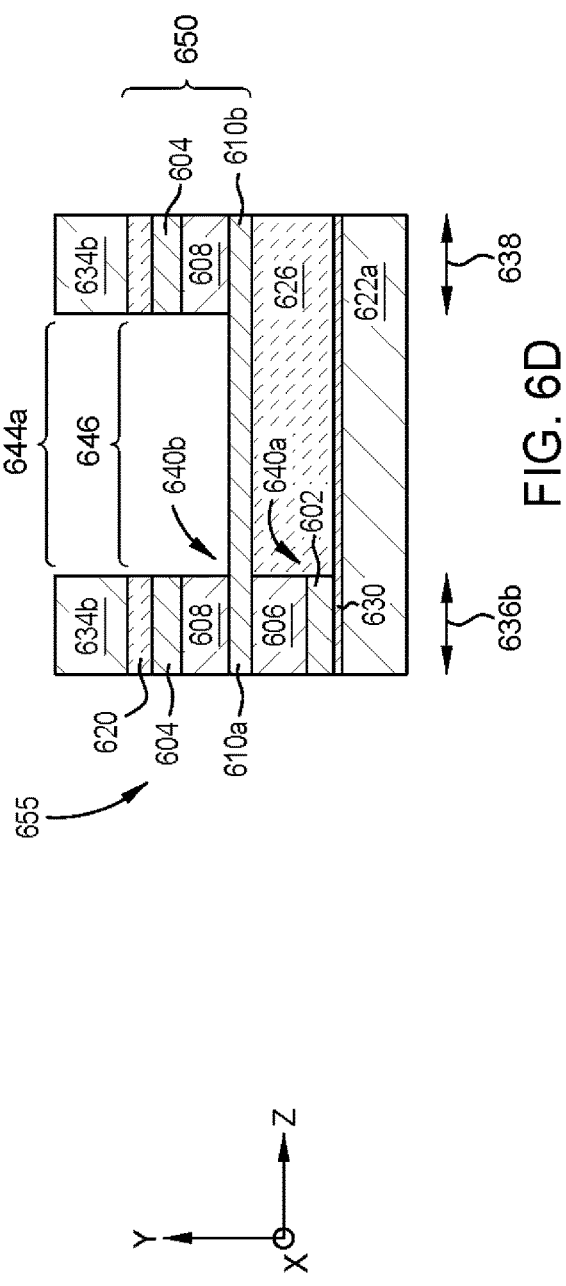

METHOD TO REDUCE BASELINE SHIFT FOR A SOT DIFFERENTIAL READER

CROSS-REFERENCE TO RELATED APPLICATIONS

This application claims benefit of U.S. provisional patent application Ser. No. 63/050,016, filed Jul. 9, 2020, which is herein incorporated by reference.

BACKGROUND OF THE DISCLOSURE

Field of the Disclosure

Embodiments of the present disclosure generally relate to a read head of a data storage device.

Description of the Related Art

The heart of the functioning and capability of a computer is the storing and writing of data to a data storage device, such as a hard disk drive (HDD). The volume of data processed by a computer is increasing rapidly. There is a need for higher recording density of a magnetic recording medium to increase the function and the capability of a computer.

In order to achieve higher recording densities, such as recording densities exceeding 2 Tbit/in$^2$ for a magnetic recording medium, the width and pitch of write tracks are narrowed, and thus the corresponding magnetically recorded bits encoded in each write track are narrowed. Attempts to achieve increasing requirements of advanced narrow gap reader sensors of read heads to achieve reading of higher recording densities have been proposed utilizing magnetoresistive sensors with free layers comprised of high saturation magnetization materials.

Typical read heads include a read sensor sandwiched between two shields. The shield-to-shield spacing of the two shields plays a crucial role in the resolution of the read sensor. However, conventional read sensors are already minimized to about 25 nm, and cannot be reduced in size much further to decrease the shield-to-shield spacing.

Therefore, there is a need in the art for an improved magnetic read head.

SUMMARY OF THE DISCLOSURE

The present disclosure generally relates to spin-orbital torque (SOT) differential reader designs. The SOT differential reader is a multi-terminal device that comprises a first shield, a first spin hall layer, a first free layer, a gap layer, a second spin hall layer, a second free layer, and a second shield. The gap layer functions as an electrode and is disposed between the first spin hall layer and the second spin hall layer. Electrical lead connections are located about the first spin hall layer, the second spin hall layer, the gap layer, the first shield, and/or the second shield. The electrical lead connections facilitate the flow of current and/or voltage from a negative lead to a positive lead. The positioning of the electrical lead connections and the positioning of the SOT differential layers improves reader resolution without decreasing the shield-to-shield spacing (i.e., read-gap).

In one embodiment, a magnetic recording head includes a first shield, a second shield, a first bias layer, a second bias layer, and a spin orbital torque (SOT) differential reader disposed between the first shield and the second shield, and between the first bias layer and the second bias layer. The SOT differential reader comprises a first free layer, a second free layer, a gap layer configured to act as a first electrical lead, a first spin hall layer, a second spin hall layer, the second spin hall layer being in contact with the first bias layer and the second bias layer, and two or more insulation layers comprising a first insulation layer disposed between the first spin hall layer and the first bias layer, and a second insulation layer disposed between the first spin hall layer and the second bias layer. The first and second free layers are configured to be independent controlled.

In another embodiment, a magnetic recording head includes a first shield, a second shield, and a SOT differential reader disposed at a media facing surface between the first shield and the second shield. The SOT differential reader comprises a first free layer, a second free layer, a gap layer configured to act as a first electrical lead, a first spin hall layer, and a second spin hall layer. A positive terminal of the first spin hall layer is electrically connected to a positive terminal of the second spin hall layer. A signal read out of the SOT differential reader is based on a voltage difference across a negative terminal of the first spin hall layer to a negative terminal of the second spin hall layer. The SOT differential reader further comprises an electrical lead recessed from a media facing surface, the electrical lead being in contact with the gap layer and the second shield, wherein the first free layer, the second free layer, the gap layer, the first spin hall layer, and the second spin hall layer are disposed at the media facing surface.

In another embodiment, a method of forming a spin orbital torque (SOT) differential reader. The method comprises depositing a first free layer over a first shield, a first spin hall layer on the first free layer, and a gap layer on the first spin hall layer to form a first stack, where the first shield has a first width extending from a media facing surface to a surface opposite to the media facing surface, removing portions of the first free layer, the first spin hall layer, and the gap layer to define a first track-width of the first stack, the first track-width of the first stack being less than the first width of the first shield, and depositing a first insulator layer in contact a first surface of the first stack, the first surface of the first stack being disposed opposite to the media facing surface. The method further comprises depositing a second free layer on the gap layer, a second spin hall layer on the second free layer, and a second insulator layer on the second spin hall layer to form a second stack on the first stack, and removing central portions of the second insulator layer, the second spin hall layer, and the second free layer to define a second track-width of the second stack and to form an electrical lead disposed on the gap layer, wherein the electrical lead is recessed from the media facing surface. A second shield layer is deposited in contact with the electrical lead.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3D illustrate a SOT differential reader, according to various embodiments.

FIGS. 4A-4H illustrate a method of forming and defining a track-width of the SOT differential reader of FIG. 3C, according to one embodiment.

FIGS. 6A-6H illustrate a method of forming and defining a stripe height of the SOT differential reader of FIG. 3D, according to one embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to spin-orbital torque (SOT) differential reader designs. The SOT differential reader is a multi-terminal device that comprises a first shield, a first spin hall layer, a first free layer, a gap layer, a second spin hall layer, a second free layer, and a second shield. The gap layer functions as an electrode and is disposed between the first spin hall layer and the second spin hall layer. Electrical lead connections are located about the first spin hall layer, the second spin hall layer, the gap layer, the first shield, and/or the second shield. The electrical lead connections facilitate the flow of current and/or voltage from a negative lead to a positive lead. The positioning of the electrical lead connections and the positioning of the SOT differential layers improves reader resolution without decreasing the shield-to-shield spacing (i.e., read-gap).

Figure 1:
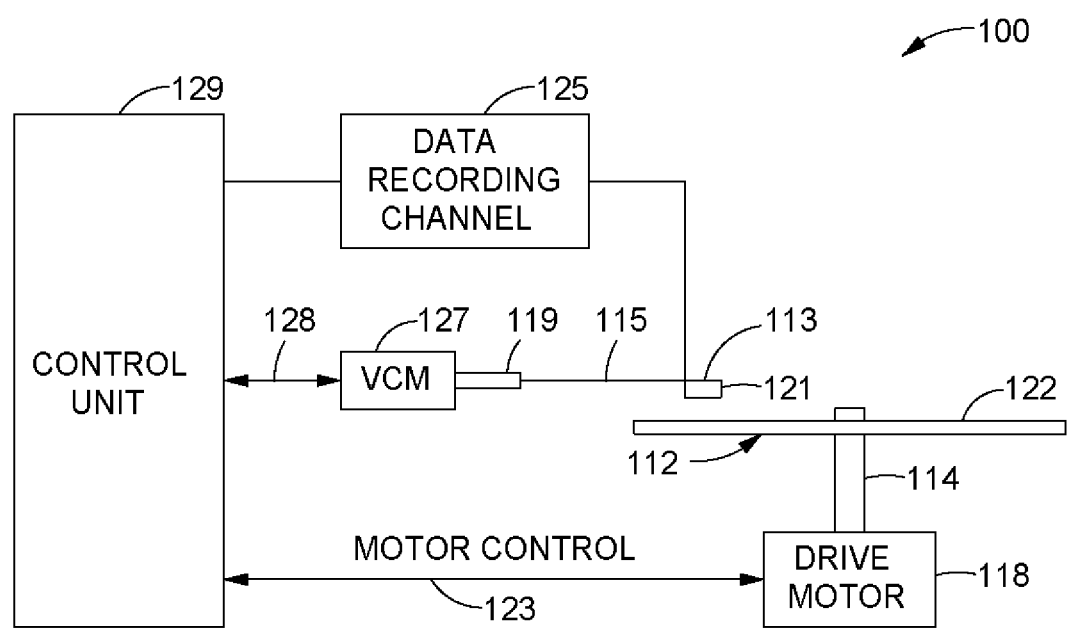
FIG. 1 illustrates a disk drive embodying this disclosure.

FIG. 1 illustrates a disk drive 100 embodying this disclosure. As shown, at least one rotatable magnetic media 112 is supported on a spindle 114 and rotated by a disk drive motor 118. The magnetic recording on each disk is in the form of any suitable patterns of data tracks, such as annular patterns of concentric data tracks (not shown) on the magnetic media 112.

At least one slider 113 is positioned near the magnetic media 112, each slider 113 supporting one or more magnetic head assemblies 121. As the magnetic media rotates, the slider 113 moves radially in and out over the media surface 122 so that the magnetic head assembly 121 may access different tracks of the magnetic media 112 where desired data are written. Each slider 113 is attached to an actuator arm 119 by way of a suspension 115. The suspension 115 provides a slight spring force which biases the slider 113 toward the media surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic media 112 generates an air bearing between the slider 113 and the media surface 122 which exerts an upward force or lift on the slider 113. The air bearing thus counterbalances the slight spring force of suspension 115 and supports slider 113 off and slightly above the magnetic media 112 surface by a small, substantially constant spacing during normal operation.

The various components of the disk drive 100 are controlled in operation by control signals generated by control unit 129, such as access control signals and internal clock signals. Typically, the control unit 129 comprises logic control circuits, storage means, and a microprocessor. The control unit 129 generates control signals to control various system operations, such as drive motor control signals on line 123 and head position and seek control signals on line 128. The control signals on line 128 provide the desired current profiles to optimally move and position slider 113 to the desired data track on the magnetic media 112. Write and read signals are communicated to and from write and read heads on the magnetic head assembly 121 by way of recording channel 125.

The above description of a typical magnetic disk storage system and the accompanying illustration of FIG. 1 are for representation purposes only. It should be apparent that disk storage systems may contain a large number of disks and actuators, and each actuator may support a number of sliders.

Figure 2:
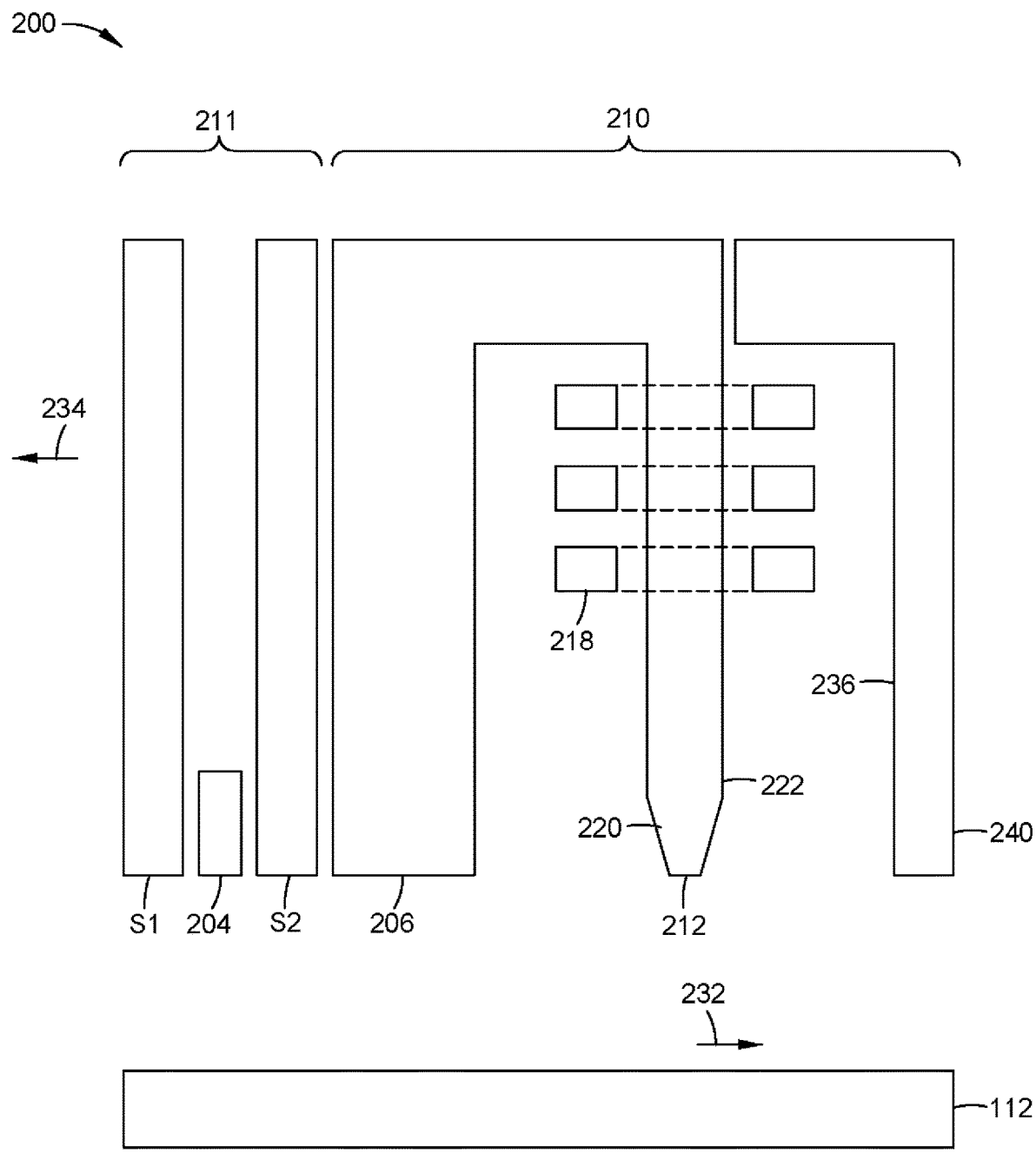
FIG. 2 is a fragmented, cross-sectional side view through the center of a read/write head facing a magnetic media, according to one embodiment.

FIG. 2 is a fragmented, cross sectional side view through the center of a read/write head 200 facing the magnetic media 112, according to one embodiment. The read/write head 200 may correspond to the magnetic head assembly 121 described in FIG. 1. The read/write head 200 includes a media facing surface (MFS) 212, such as an air bearing surface (ABS), a magnetic write head 210, and a magnetic read head 211, and is mounted such that the MFS 212 is facing the magnetic media 112. In FIG. 2, the magnetic media 112 moves past the write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing element 204 located between MR shields S1 and S2. The magnetic fields of the adjacent magnetized regions in the magnetic media 112 are detectable by the MR (or MTJ) sensing element 204 as the recorded bits.

The write head 210 includes a return pole 206, a main pole 220, a trailing shield 240, and a coil 218 that excites the main pole 220. The coil 218 may have a "pancake" structure which winds around a back-contact between the main pole 220 and the return pole 206, instead of a "helical" structure shown in FIG. 2. A trailing gap (not shown) and a leading gap (not shown) may be in contact with the main pole and a leading shield (not shown) may be in contact with the leading gap. A recording magnetic field is generated from the main pole 220 and the trailing shield 240 helps making the magnetic field gradient of the main pole 220 steep. The main pole 220 may be a magnetic material such as an FeCo alloy. The main pole 220 may include a trailing surface 222 which may be parallel to a leading surface 236 of the trailing shield 240. The main pole 220 may be a tapered write pole (TWP) with a trailing edge taper (TET) configuration. In one embodiment, the main pole 220 has a saturated magnetization (Ms) of 2.4 T and a thickness of about 300 nanometers (nm). The main pole 220 may comprise ferromagnetic materials, typically alloys of one or more of Co, Fe and Ni. The trailing shield 240 may be a magnetic material such as NiFe alloy. In one embodiment, the trailing shield 240 has an Ms of about 1.2 T to about 1.6 T.

Figure 3C:
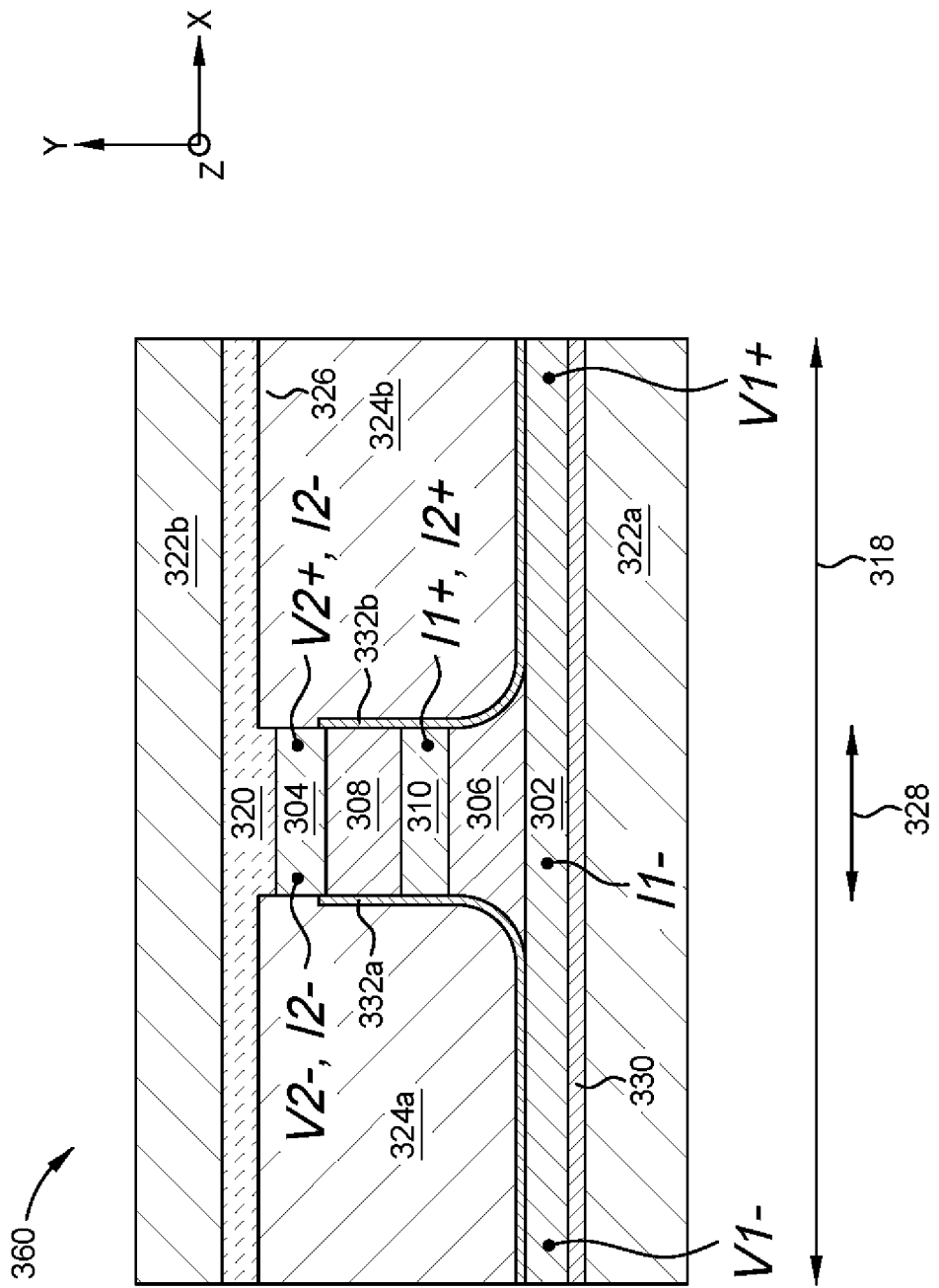

FIGS. 3A-3E illustrate a SOT differential reader, according to various embodiments. FIGS. 3A and 3B illustrate the SOT differential readers 300A, 300B, where each of FIGS. 3A and 3B has: (1) a top stack configuration view of the reader and (2) a bottom abstract view showing the positioning of the free layers relative to a magnetic media when the recording head is over the media, with the other layers in the stack configuration omitted. The SOT differential reader 300A, 300B may be the SOT differential reader 204 located between the two shields S1 and S2 of FIG. 2. The SOT differential readers 300A, 300B have the same electrical connection configuration. However, the first SOT differential reader 300A and the second SOT differential reader 300B may be positioned perpendicular to different areas of the magnetic media 312. The positioning of the SOT differential readers 300A, 300B about the magnetic media 312 may change the induced voltage polarity of the first spin hall layers 302a, 302b and the second spin hall layers 304a, 304b.

As shown in the top stack configuration view of FIGS. 3A and 3B, a first free layer (FL) 306 is disposed over a first spin hall effect (SHE) layer 302a, 302b (collectively referred to as first SHE layer 302), a gap layer (GL) 310 disposed over the first FL 306, a second FL 308 disposed over the GL 310, and a second SHE layer 304a, 304b (collectively referred to as second SHE layer 304) disposed over the second FL 308. In the descriptions herein, the plurality of SHE layers may be referred to as a plurality of spin hall layers (SHLs) for exemplary purposes. The SOT differential readers 300A, 300B may each have a stripe height in the z-direction of between about 100 Angstroms to about 400 Angstroms.

In the bottom view of FIGS. 3A and 3B, the first FL 306 and the second FL 308 are shown rotated 90 degrees from the stack configuration view above, and are positioned perpendicularly over the magnetic media 312, where the magnetic media 312 may be the magnetic media 112 of FIG. 1. The first FL 306 and the second FL 308 are parallel with the magnetic field direction of the magnetic media 312. The magnetic media 312 includes a first magnetic field direction, indicated by a first arrow pointing up in bits 314a and 314c, and a second magnetic field direction, indicated by a second arrow pointing down in bits 314b and 314d. The magnetic media 312 further includes a first bit 314a with a first magnetic field direction, a second bit 314b with a second magnetic field direction, a third bit 314c with the first magnetic field direction, and a fourth bit 314d with the second magnetic field direction. While four bits 314a-314d are shown, the magnetic media may have any number of bits.

In the top stack configuration view of FIG. 3A, a positive end or pole 305b of the first SHL 302a is electrically connected to a positive end or pole 305b of the second SHL 304a, and a negative end or pole 305a of the first SHL 302a is electrically connected to a negative end or pole 305a of the second SHL 304a. The voltage polarity of the first SHL 302a and the second SHL 304a (i.e., the positive end or pole 305b and the negative end or pole 305a) depends on the positioning of the first and the second FLs 306, 308 about the magnetic media, as described below. In another embodiment, the voltage polarity of the first SHL 302a and/or the second SHL 304a may be flipped. The listed voltage polarity of the first and the second SHLs 302a, 304a are not intended to be limiting, but to provide an example of a possible embodiment. Referring to the bottom abstract view of FIG. 3A, when the first and second FLs 306, 308 are both positioned perpendicular over a single bit of the plurality of bits 314a-314d, such as the third bit 314c, of the magnetic media 312, the magnetic field of the third bit 314c imposes a magnetic force on the first and the second FLs 306, 308. As a result of the magnetic force imposed on the first and the second FLs 306, 308, the magnetic moment of the first and the second FLs 306, 308 are both in the same direction as the magnetic field of the third bit 314c.

In the top stack configuration view of FIG. 3B, a positive end or pole 309b of the first SHL 302b is electrically connected to a negative end or pole 307a of the second SHL 304b, and a negative end or pole 309a of the first SHL 302b is electrically connected to a positive end or pole 307b of the second SHL 304b. The voltage polarity of the first SHL 302b and the second SHL 304b (i.e., the positive end or pole 307b, 309b and the negative end or pole 307a, 309) depends on the positioning of the first and the second FLs 306, 308 about the magnetic media, as described below. In another embodiment, the voltage polarity of the first SHL 302b and/or the second SHL 304b may be flipped. The listed voltage polarity of the first and the second SHLs 302b, 304b are not intended to be limiting, but to provide an example of a possible embodiment. In the description herein, the position of the negative ends or poles and the positive ends or poles of the SHLs referenced may be flipped. Therefore, embodiments not listed are contemplated and relevant to the current description. Referring to the bottom abstract view of FIG. 3B, when the first and second FLs 306, 308 are each positioned over adjacent bits of the plurality of bits 314a-314d, such as the third bit 314c and the fourth bit 314d, of the magnetic media 312, the magnetic field of the second bit 314b imposes a magnetic force on the first FL 306, and the third bit 314c imposes a magnetic force on the second FL 308, which is opposite to the magnetic force imposed on the first FL 306. As a result of the magnetic force imposed on the first FL 306 and the second FL 308, the magnetic moment of the first FL 306 is in the same direction as the magnetic field of the second bit 314b, and the magnetic moment of the second FL 308 is in the same direction as the magnetic field of the third bit 314c. In FIG. 3B, because the first and the second FLs 306, 308 are located over adjacent bits of the plurality of bits 314a-314d of the magnetic media 312, the first FL 306 has a magnetic field direction opposite of the second FL 308 magnetic field direction.

In FIGS. 3A and 3B, the first SHL layer 302a, 302b and the second SHL 304a, 304b each comprises the same material and has the same thickness in the y-direction. The first and second SHLs 302a, 302b, 304a, 304b may be formed by a non-magnetic heavy metal material selected from a group that includes Ta, Pt, W, Hf, Bi, and alloys thereof. Additionally, it is to be understood that while Ta, Pt, W, Hf, Bi, and alloys thereof have been exemplified as the materials of the first and the second SHLs 302a, 304a, other materials are contemplated, and the embodiments discussed herein are not limited. For example, BiSb and BiSe may be used as the material for the first and the second SHLs 302, 304. The first and the second SHLs 302, 304 may have a greater width in the x-direction than the first and second FL layers 306, 308 and the GL 310. In one embodiment, the first and second SHLs 302, 304 have the same width in the x-direction. In another embodiment, the first and second SHLs 302, 304 have different widths in the x-direction.

In FIG. 3A, the first SHL 302a and the second SHL 304a each generates a lateral voltage signal (i.e., a SHE signal) inside each respective first and second SHLs 302a, 304a. The generated lateral voltage signal may be due to the spin hall effect. The lateral voltage signal polarity may depend on the electron current flow direction and the magnetic orientation of the first and second FLs 306, 308. For example, in the bottom view of FIG. 3A, the first and second FLs 306, 308 are each positioned perpendicularly over the same bit, such as the third bit 314c. The first and second SHLs 302a, 304a have the same SHE voltage polarity, where the side in the negative x-direction is a negative end 305a and the side in the positive x-direction is a positive end 305b.

Furthermore, the negative ends 305a of the first and the second SHLs 302a, 304a are connected such that the negative ends 305a of the first and the second SHLs 302a, 304a share an equal voltage potential. The reader signal output may be determined by the voltage difference or the differential voltage 311 between the positive ends 305b of the first and the second SHLs 302a, 304a, which may be the SOT differential reader signal output. Because the first and the second SHLs 302a, 304a each includes the same materials and the same current flow direction, the SHE voltage induced by the first SHL 302a may be equal in both polarity and magnitude to the SHE voltage induced by the second SHL 304a. The differential voltage 311 between the two positive ends 305b may be either canceled or reduced. The differential voltage 311 may be a net differential output of about zero.

A first current 313 travels from the first SHL 302a to the GL 310 and a second current 315 travels from the GL 310 to the second SHL 304a. By independently controlling the first current 313 and the second current 315, the amplitude of the differential voltage (dVsh) of the upper reader (e.g., the section of the SOT differential reader 300A that the second current 315 is in contact with) and the lower reader (e.g., the section of the differential reader 300A that the first current 313 is in contact with) may be matched. Furthermore, a dusting layer (not shown) may be disposed about the lower reader, such that the first current 313 may be shunted. As such, the SOT differential reader 300A is a multi-terminal device. Because the first and the second SHLs 302a, 304a have the same voltage polarity, the signal output may be greatly reduced or substantially cancelled. By greatly reducing or substantially cancelling the signal output, the baseline shift may be reduced.

In the bottom view of FIG. 3B, the first FL 306 and the second FL 308 are located over adjacent bits, such as the first FL 306 being positioned perpendicularly over the second bit 314b and the second FL being positioned perpendicularly over the third bit 314c. The first and the second FLs 306, 308 have different and opposite magnetization. For example, the first SHL 302b has a first SHE voltage, where the side in the negative x-direction is a positive end 309b and the side in the positive x-direction is a negative end 309a. Likewise, the second SHL 304b has a second SHE voltage where the side in the negative x-direction is a negative end 307a and the side in the positive x-direction is a positive end 307b.

Furthermore, the positive end 309b of the first SHL 302b and the negative end 307a of the second SHL 304b are connected and share an equal voltage potential. The differential voltage 311 is determined by the difference between the voltage of the positive end 307b of the second SHL 304b and the voltage of the negative end 309a of the first SHL 302b, which may be the SOT differential reader signal output. Because the induced voltage directions of the first and the second SHLs 302b, 304b are opposite of each other, the differential voltage 311 may effectively double the output signal. A first current 313 travels from the first SHL 302b to the GL 310, and a second current 315 travels from the GL 310 to the second SHL 304b. As such, the SOT differential reader 300B is a multi-terminal device. Because the first and the second SHLs 302b, 304b have opposite voltage directions, the signal output may be effectively doubled or greatly increased. Thus, the greater signal output may effectively increase linear resolution.

FIG. 3C illustrates a MFS view of a SOT differential reader 360, according to one embodiment. The SOT differential reader 360 may be the SOT differential reader 300A of FIG. 3A and/or the SOT differential reader 300B of FIG. 3B. Furthermore, the first SHLs 302a, 302b may be the first SLH 302 and the second SHLs 304a, 304b may be the second SHL 304. In the descriptions herein, the SHLs may be referred to as the SHE layers for exemplary purposes.

The SOT differential reader 360 further includes a first shield 322a disposed below a first insulation layer 330, where the first SHL 302 is disposed on the first insulation layer 330. Furthermore, a second insulation layer 332a is disposed along the top edge of the left side of the SHL 302 (i.e., between the first SHL 302 and a first bias layer 324a) and on the left side of the first FL 306, the GL 310, and the second FL 308 (i.e., adjacent to the first bias layer 324a). A third insulation layer 332b is deposited along the top edge of the right side of the SHL 302 (i.e., between the first SLH 302 and a second bias layer 324b) and on the right side of the first FL 306, the GL 310, and the second FL 308 (i.e., adjacent to the second bias layer 324b). A first bias layer 324a is disposed on the second insulation layer 332a. A second bias layer 324b is disposed on the third insulation layer 332b. A fourth insulation layer 320 is disposed over the first and second bias layers 324a, 324b and the second SHL 304. A second shield 322b is disposed on the fourth insulation layer 320. The first and second bias layers 324a, 324b may comprise a hard bias material or a soft bias material.

The insulation layers 330, 332a, 332b, 320 may be placed in the SOT differential reader 360 such that electrical shorting between the first shield 322a, the first SHL 302, the first FL 306, the GL 310, the second FL 308, the second SHL 304, the second shield 322, the first bias layer 324a, and the second bias layer 324b may be avoided. Suitable materials for the insulation layers 330, 332a, 332b, 320 include dielectric materials such as aluminum oxide, silicon oxide, magnesium oxide, and silicon nitride. The insulation layers 330, 332a, 332b, 320 may be formed by well-known deposition methods such as atomic layer deposition (ALD), physical vapor deposition (PVD), ion bean deposition (IBD), or sputtering. The insulation layers 330, 332a, 332b, 320 may have a thickness of between about 10 Angstroms to about 100 Angstroms.

In some embodiments, the first FL 306 and the second FL 308 comprise the same material and have a same thickness in the y-direction. The first and the second FLs 306, 308 have a greater thickness in the y-direction than the first and the second SHLs 302, 304. The first and the second FLs 306, 308 each comprises a CoFe/CoFeB/Ta/NiFe multilayer stack. The CoFe layer may have a thickness of between about 3 Angstroms to about 10 Angstroms. The CoFeB layer may have a thickness of between about 10 Angstroms to about 20 Angstroms. The Ta layer may have a thickness of between about 0.5 Angstroms to about 2 Angstroms. The NiFe layer may have a thickness of between about 3 Angstroms to about 100 Angstroms, such as between about 3 Angstroms and about 10 Angstroms or between about 10 Angstroms and about 100 Angstroms. The first and the second FLs 306, 308 may be formed by well-known deposition methods such as sputtering. Additionally, it is to be understood that while CoFe/CoFeB/Ta/NiFe have been exemplified as the materials of the first and the second FLs 306, 308, other materials are contemplated, and the embodiments discussed herein are not limited to CoFe/CoFeB/Ta/NiFe for the first and the second FLs 306, 308. Furthermore, the previously mentioned dimensions are not intended to be limiting, but to provide an example of a possible embodiment.

The GL 310 has a smaller thickness in the y-direction than the first and the second SHLs 302, 304. The GL 310 may be formed by a non-magnetic conducting material such as Cr with a thickness of between about 10 Angstroms to about 50 Angstroms. In some embodiments, the GL 310 may have a thickness of about 0 Angstroms to about 20 Angstroms. It is to be understood that while Cr is exemplified as the GL 310, other materials are contemplated, and the embodiments discussed herein are not limited to Cr for the GL 310. In some embodiments, insulating materials may be used for the GL 310 material, such as when the GL 310 has a thickness of less than about 1 nm. In one embodiment, the GL 310 includes an electrode to allow for the independent adjustment of the spin hall angle properties of the first SHL 302 and the second SHL 304.

The first shield 322a and the second shield 322b each comprises an electrically conductive material selected from a group that includes Cu, W, Ta, Al, NiFe, CoFe, and alloys thereof. The shield materials may either include NiFe alloy, CoFe alloy, or a combination of NiFe alloy or CoFe alloy with Cu, W, Ta, and Al. The thickness of each of the first shield 322a and the second shield 322b may be between about 20 nm and about 500 nm. Additionally, it is to be understood that while NiFe, CoFe, Cu, W, Ta, Al, and alloys thereof have been exemplified as the first shield 322a and the second shield 322b materials, other materials are contemplated, and the embodiments discussed herein are not limited to NiFe, CoFe, Cu, W, Ta, Al, and alloys thereof for the first shield 322a and the second shield 322b.

In some embodiments, the first and second bias layers 324a, 324b are first and second hard bias layers, respectively. The first hard bias layer and the second hard bias layer may comprise a multilayer structure comprising a seed layer(s) and a bulk layer. In one embodiment, the hard bias layer comprises a Ta seed layer, a Cr or a W seed layer on the Ta seed layer, and a CoPt bulk layer disposed on the Cr or the W seed layer. In some embodiments, the hard bias layer comprises a multilayer of the previously mentioned materials. Additionally, it is to be understood that while Ta, W, Cr, and CoPt have been exemplified as the first hard bias layer and the second hard bias layer materials, other materials are contemplated, and the embodiments discussed herein are not limited to Cu, Ta, W, Cr, and CoPt for the first hard bias layer and the second hard bias layer.

In some embodiments, the first bias layer 324a and the second bias layer 324b are a first soft bias layer and a second soft bias layer, respectively. The first soft bias layer and the second soft bias layer may comprise a multilayer structure that includes soft magnetic materials. In one embodiment, the soft bias layers comprise a material selected from a group that includes NiFe, CoFe, CoNi, CoFeNi, CoFeB, Co, alloys thereof, and/or their multilayers. Additionally, it is to be understood that while NiFe, CoFe, CoNi, CoFeNi, CoFeB, Co, alloys thereof, and/or their multilayers have been exemplified as the soft bias layer materials, other materials are contemplated, and the embodiments discussed herein are not limited to NiFe, CoFe, CoNi, CoFeNi, CoFeB, Co, alloys thereof, and/or their multilayers for the soft bias layers.

When the SOT differential reader 360 includes soft bias layers instead of hard bias layers, an antiferromagnetic (AFM)/capping layer (not shown) is deposited between each soft bias layer and the insulation layer 320. The AFM/capping layer comprises a material selected from a group of AFM materials that includes IrMn, FeMn, PtMn, and other non-magnetic conducting layers. Furthermore, the AFM/capping layer may comprise a group of AFM materials and one or more materials from a group that includes IrMn, FeMn, PtMn, Ta, Ru, or Ti, other non-magnetic materials, and/or their multilayers. The AFM/capping layer may be formed by well-known deposition methods, such as sputtering. The AFM/capping layer may have a thickness of between about 40 Angstroms to about 150 Angstroms. Additionally, it is to be understood that while IrMn, FeMn, PtMn, Ta, Ru, Ti and their multilayers have been exemplified as the AFM/capping layer materials, other materials are contemplated and the embodiments discussed herein are not limited to IrMn, FeMn, PtMn, Ta, Ru, or Ti or their multilayers for the AFM/capping layer.

Electrical leads are placed about the first SHL 302, the second SHL 304, and the GL 310. For example, the first SHL 302 includes a first negative voltage terminal (V1−), a first positive voltage terminal (V1+), and a first negative current terminal (I1−). The second SHL 304 includes a second negative voltage terminal (V2−), a second positive voltage terminal (V2+), and a second negative current terminal (I2−) located on either side of the second SHL 304. Furthermore, the GL 310 includes a first positive current terminal (I1+) and a second positive current terminal (I2+). It is to be understood that the illustrated polarity of the voltage terminals of the first and the second SHLs 302, 304 are for exemplary purposes and the voltage polarity of the first and second SHLs 302, 304 may depend on the direction of the current and the positioning of the first and the second FLs 306, 308 relative to the bits, such as the bits 314a-314d, of the magnetic media 312. Furthermore, the first negative voltage terminal (V1−) and the second negative voltage terminal (V2−) may be electrically shorted together as to provide a common voltage terminal.

The differential voltage (e.g., the differential voltage 311) between the first positive voltage terminal (V1+) of the first SHL 302 and the second positive voltage terminal (V2+) of the second SHL 304 is the SOT differential reader signal output. Because the GL 310 includes separate current terminals, the current applied to the first FL 306 and the second FL 308 may be adjusted independently of one another. Therefore, the magnetic response of the first FL 306 and the second FL 308 may be matched when the first FL 306 and the second FL 308 includes different properties, such as different materials or thicknesses. The current and the voltage directions of FIG. 3A may represent the current and the voltage directions of FIG. 3C.

The first SHL 302 has a first track width 318 that is substantially equal to or less than the width of the first shield 322a, and the second SHL 304 has a second track width 328 that is substantially equal to the width of the stack that includes the first FL 306, the GL 310, and the second FL 308. In some embodiments, the first track width 318 has a width that is less than the width of the first shield 322a. The first track width 318 may be about 200 Angstroms to about 2000 Angstroms wide. The second track width 328 may be about 100 Angstroms to about 400 Angstroms wide. Because the first track width 318 of the first SHL 302 is greater than the second track width 328 of the second SHL 304, the signal output of the lower reader (i.e., the first FL 306) is greater than the signal output of the upper reader (i.e., the second FL 308).

The unsymmetrical signal output between the lower reader and the upper reader may cause a baseline shift (e.g., the signal output not being canceled out). However, by independently controlling the first current 313 and the second current 315 (i.e., a three lead circuitry), the signal output of the lower reader and the upper reader may be matched, thus reducing the probability of a baseline shift. A dusting layer (not shown) may be disposed about the lower reader to incorporate a shunting design to decrease the electron flow of the first current 313. Furthermore, by selecting a material or an appropriate thickness for the second SHL 304 that includes a higher spin polarization angle, resulting in a higher spin hall angle, the signal output of the upper reader may also be increased. Likewise, the second SHL 304 thickness may be decreased which may increase the signal output of the upper reader.

Figure 3D:
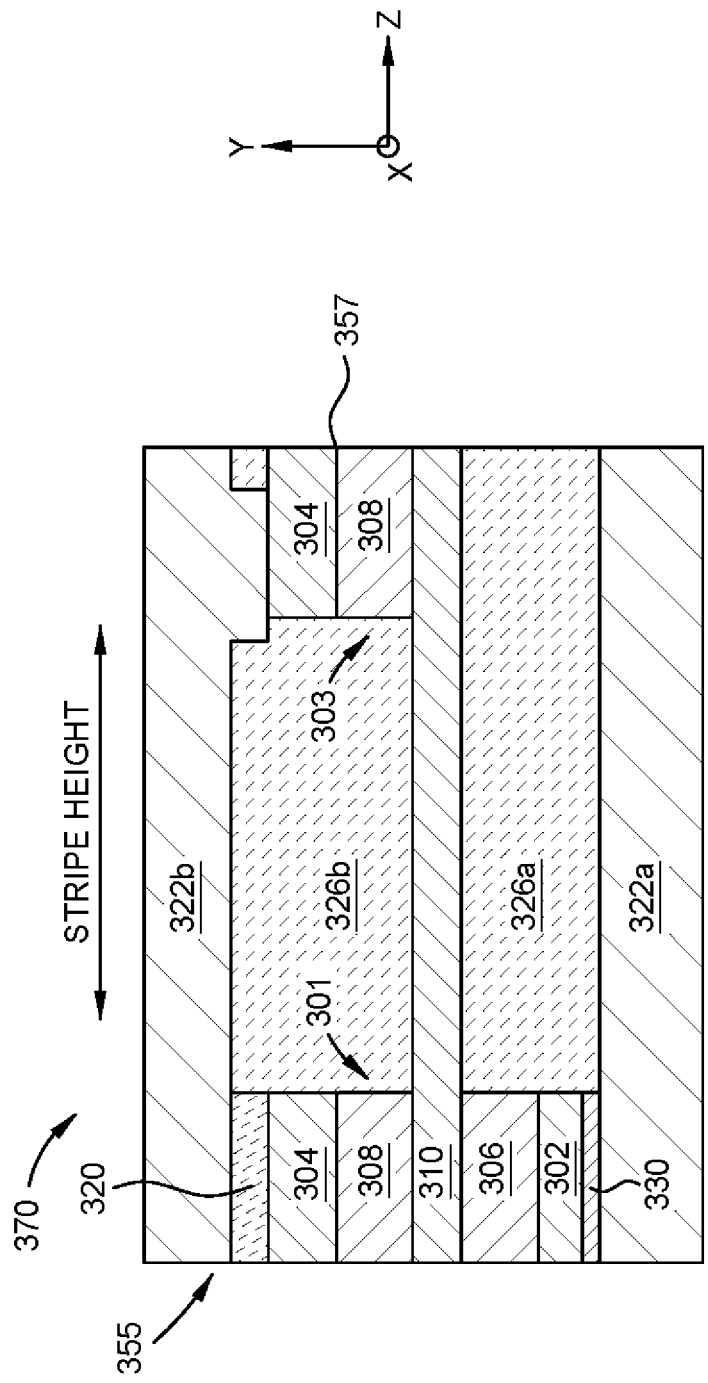

FIG. 3D illustrates a side cross-sectional view of a SOT differential reader 370, according to one embodiment. The SOT differential reader 370 includes a first insulation layer 330 disposed on the first shield 322a, a first SHL 302 disposed over the first insulation layer 330, a first FL 306 disposed over the first SHL 302, a GL 310 disposed over the first FL 306, a second FL 308 disposed over the GL 310, and second SHL 304 disposed over the second FL 308. In the current embodiment, the second FL 308 and the second SHL 304 includes two separated portions or sections, where a first section 301 is adjacent to a media facing surface (MFS) 355 and a second section 303 is disposed on a side 357 opposite to the MFS 355 in the z-direction. The GL 310 extends from the MFS 355 to the side 357 opposite of the MFS 355 and is in contact with the second section 303.

A fourth insulation layer 320 is disposed over the second SHL 304. Furthermore, a fifth insulation layer 326a is disposed between the first shield 322a and the GL 310. A sixth insulation layer 326b is disposed between the GL 310 and the second shield 322b, and between the first section 301 and the second section 303. A second shield 322b is disposed over the fourth insulation 320 and the second section of the second SHL 304. The second shield 322b is in contact with the second section of the second SHL 304.

FIGS. 4A-4H illustrate a method of forming and defining a track-width of the SOT differential reader 360 of FIG. 3C, according to one embodiment. While different reference numerals may be used in FIGS. 4A-4H, the materials of the layers forming the SOT differential reader 360 are the same as the materials described in FIG. 3C above. FIGS. 4A-4H illustrate a MFS view of the SOT differential reader 360 as it is being fabricated.

Figure 4A:
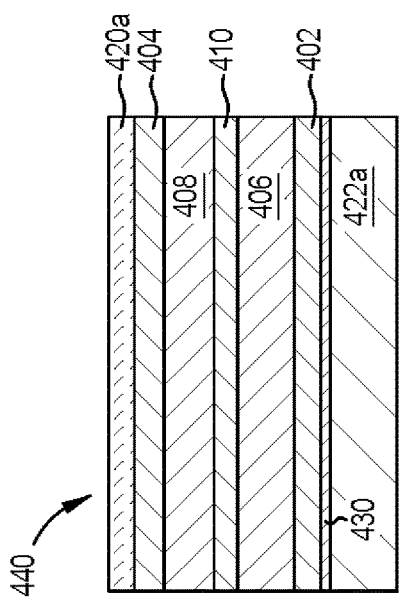

In FIG. 4A, a first insulation layer 430 is deposited on a first shield 422a, a first SHL 402 is deposited on the first insulation layer 430, a first FL 406 is deposited on the first SHL 402, a GL 410 is deposited on the first FL 406, a second FL 408 is deposited on the GL 410, a second SHL 404 is deposited on the second FL 408, and a second insulation layer 420a is deposited on the second SHL 404 to form a stack 440. In some embodiments, the GL 410 includes an electrode to allow for the independent adjustment of the magnetic properties of the first FL 406 and the second FL 408.

Figure 4B:
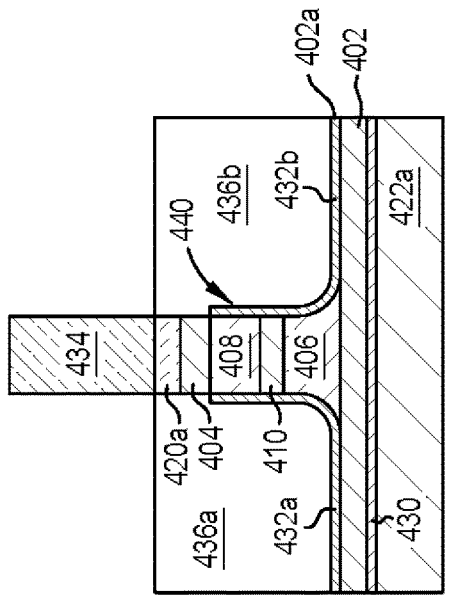
Figure 4C:
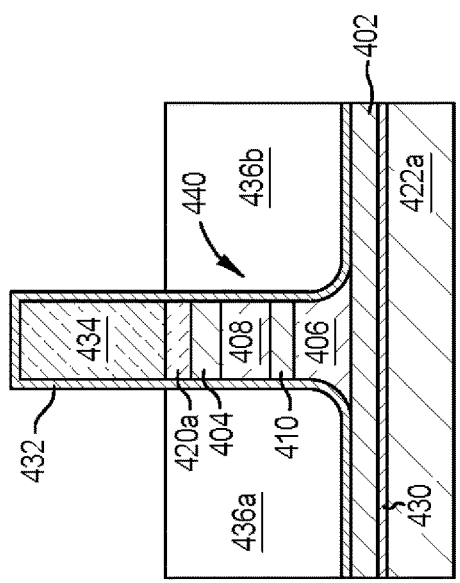

In FIG. 4B, a photoresist or photo stencil 434 is deposited over the stack 440 on the second insulation layer 420a to define a track-width of the stack 440. The portions of the second insulation layer 420a, the second SHL 404, the second FL 408, the GL 410, and the first FL 406 uncovered by the photo stencil 434 are then removed (i.e., the outer ends of the stack 440) to reveal refill layers 436a, 436b disposed behind the stack 440. The removal of the outer ends of the stack 440 defines the track-width or the horizontal width of the stack 440. In FIG. 4B, first and second thin layers of insulation material 432a, 432b are deposited on a top surface 402a of the first SHL 402 and on either side of the first FL 406, the GL 410, and the second FL 408. The first insulation layer 432a is disposed adjacent to the refill layer 436a, and the second insulation layer 432b is disposed adjacent to the refill layer 436b. In FIG. 4C, a thin layer of additional insulation material 432 is deposited on either side of the second SHL 404, the second insulation layer 420a, and the photo stencil 434 (e.g., the sides in contact with the refill layers 436a, 436b). The thin layer of additional insulation material 432 connects the first insulation layer 432a to the second insulation layer 432b.

Figure 4D:
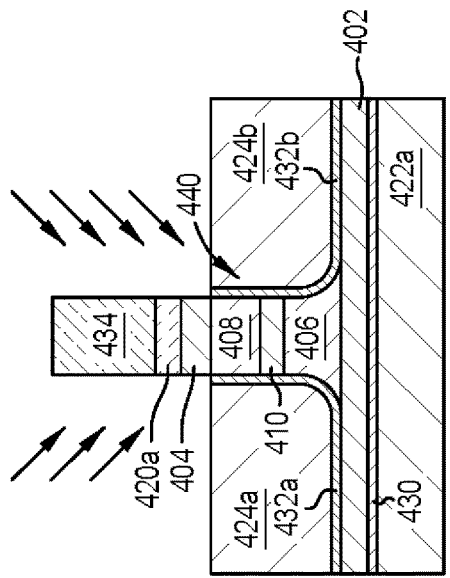

In FIG. 4D, hard bias layers 424a, 424b are deposited over the first SHL 402 (e.g., on the first and second layers of the insulating material 432a, 432b) and on both sides of the first FL 406, the GL 410, and the second FL 408. The portions of the additional insulation material 432 and the refill layers 436a, 436b disposed in contact with the second SHL 404, the second insulation layer 420a, and the photo stencil 434 are then removed, for example by ion milling. Thus, the first insulation layer 432a and the second insulation layer 432b remain in contact with the first SHL 402, the first FL 406, the GL 410, and the second FL 408 such that the first and second insulation layers 432a, 432b are disposed between the first SHL 402, the first FL 406, the GL 410, and the second FL 408 and the hard bias layers 424a, 424b. In other words, the first SHL 402, the first FL 406, the GL 410, and the second FL 408 are not in direct contact with the hard bias layers 424a, 424b. The first hard bias material 424a is deposited on the first insulation layer 432a to a level below the second SHL 404, and the second hard bias material 424b is deposited on the second insulation layer 432b to a level below the second SHL 404. In one embodiment, the level is in line with the bottom edge of the second SHL 404.

In FIG. 4E, additional hard bias material 424c is deposited around and in contact with the second SHL 404, the second insulation layer 420a, and the photo stencil 434. The additional hard bias material 424c and the hard bias layers 424a, 424b form a cohesive hard bias layer, and are collectively referred to as hard bias layers 424 or hard bias material 424. In FIG. 4F, the photo stencil 434 and a portion of the hard bias layer 424 in contact with the photo stencil 434 are removed by a process such as CMP assisted lift off.

In FIG. 4G, after defining the track-width and the stripe height of the SOT differential reader though the previously discussed steps, a fourth insulation layer 420b is deposited on and in contact with the second insulation layer 420a and the hard bias layer 424. In FIG. 4H, a second shield 422b is deposited on and in contact with the fourth insulation layer 420b to form the SOT differential reader 360. In one embodiment, the first and second shields 422a, 422b comprise the same or similar materials. In another embodiment, the first and second shields 422a, 422b comprise different materials.

Suitable materials for the insulation layers 420a, 420b, 430, 432a, 432b include dielectric materials such as aluminum oxide, silicon oxide, and silicon nitride. The insulation layers 420a, 420b, 430, 432a, 432b may be formed by well-known deposition methods such as atomic layer deposition (ALD) or sputtering. The insulation layers 420a, 420b, 430, 432a, 432b may have a thickness of between about 10 Angstroms to about 700 Angstroms.

Figure 5B:
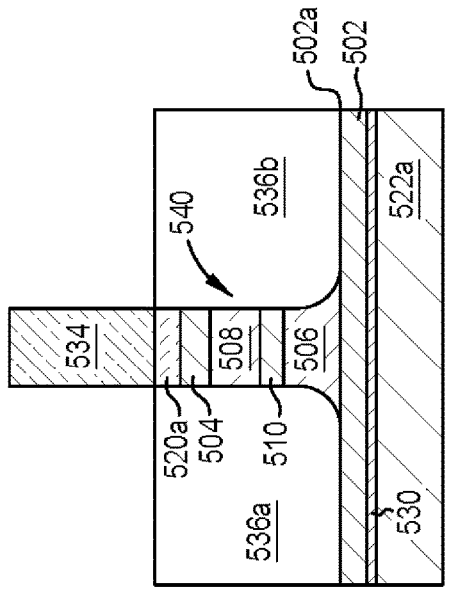
FIGS. 5A-5H illustrate a method of forming and defining a track-width of the SOT differential reader of FIG. 3C, according to one embodiment.
Figure 5D:
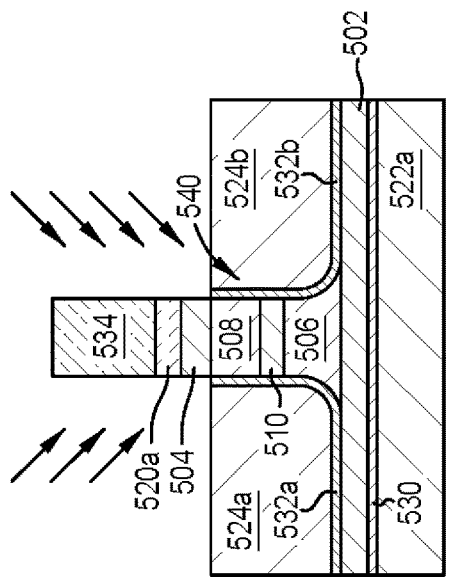
Figure 5A:
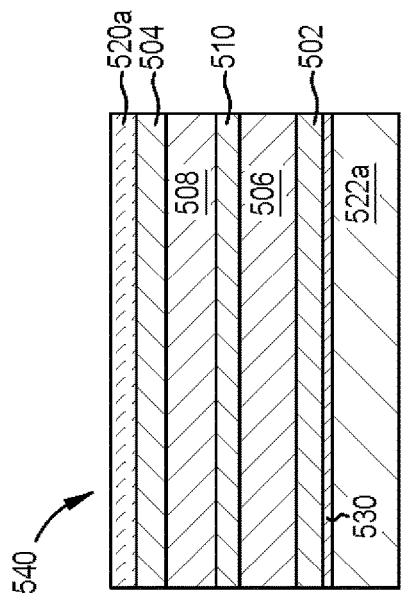

FIGS. 5A-5H illustrate a method of forming and defining a track-width of the SOT differential reader 360 of FIG. 3C, according to one embodiment. FIGS. 5A-5H illustrate a MFS view of the SOT differential reader 360 as it is being fabricated. While different reference numerals may be used in FIGS. 5A-5H, the materials of the layers forming the SOT differential reader 360 are the same as the materials described in FIG. 3C above. In FIG. 5A, a first insulation layer 530 is deposited on a first shield 522a, a first SHL 502 is deposited on the first insulation layer 530, a first FL 506 is deposited on the first SHL 502, a GL 510 is deposited on the first FL 506, a second FL 508 is deposited on the GL 510, a second SHL 504 is deposited on the second FL 508, and a second insulation layer 520a is deposited on the second SHL 504 to form a stack 540. In one embodiment, the GL 510 includes an electrode to allow for the independent adjustment of the magnetic properties of the first FL 506 and the second FL 508.

Figure 5C:
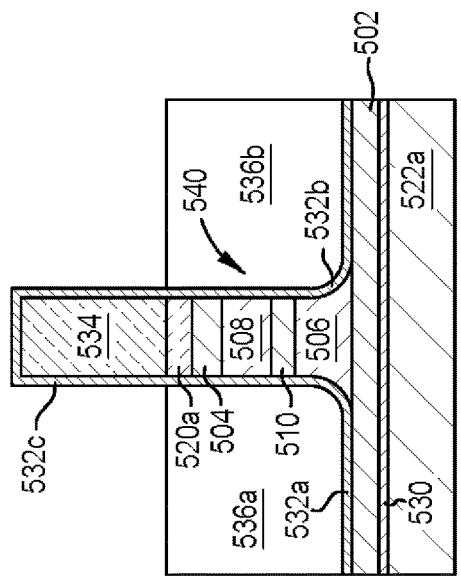

In FIG. 5B, a photoresist or photo stencil 534 is deposited over the stack 540 on the second insulation layer 520a to define a track-width of the stack 540. The portions of the second insulation layer 520a, the second SHL 504, the second FL 508, the GL 510, and the first FL 506 uncovered by the photo stencil 534 are then removed (i.e., the outer ends of the stack 540) to reveal refill layers 536a, 536b disposed behind the stack 540. The removal of the outer ends of the stack 540 defines the track-width or the horizontal width of the stack 540. In FIG. 5C, first and second thin layers of insulation material 532a, 532b are deposited on a top surface 502a of the first SHL 502 and around the first FL 506, the GL 510, and the second FL 508. The first insulation layer 532a is disposed adjacent to the refill layer 536a, and the second insulation layer 532b is disposed adjacent to the refill layer 536b. A third thin layer of insulation material 532c is deposited around the second SHL 504, the second insulation layer 520a, and the photo stencil 534, connecting to the first and second insulation layers 532a, 532b.

In FIG. 5D, side shield layers 524a, 524b are deposited over the first SHL 502 (e.g., on the first and second insulation layers 532a, 532b) and on both sides of the first FL 506, the GL 510, and the second FL 508. The portions of the third insulation layer 532c and the refill layers 536a, 536b disposed in contact with the second SHL 504, the second insulation layer 520a, and the photo stencil 534 are then removed, for example by milling. Thus, the first insulation layer 532a and a second insulation layer 532b remain in contact with the first SHL 502, the first FL 506, the GL 510, and the second FL 508 such that the first and second insulation layers 532a, 532b are disposed between the first SHL 502, the first FL 506, the GL 510, and the second FL 508 and the side shield layers 524a, 524b. In other words, the first SHL 502, the first FL 506, the GL 510, and the second FL 508 are not in direct contact with the side shield layers 524a, 524b.

The side shield layers 524a, 524b may comprise a soft bias material. In one embodiment, the soft bias includes a material selected from a group that includes NiFe, CoFe, CoNi, CoFeNi, CoFeB, Co, alloys thereof, and/or multilayers. Additionally, it is to be understood that while NiFe, CoFe, CoNi, CoFeNi, CoFeB, Co, alloys thereof, and/or their multilayers have been exemplified as the soft bias materials, other materials are contemplated, and the embodiments discussed herein are not limited to NiFe, CoFe, CoNi, CoFeNi, CoFeB, Co, alloys thereof, and/or their multilayers for the soft bias.

Figure 5E:
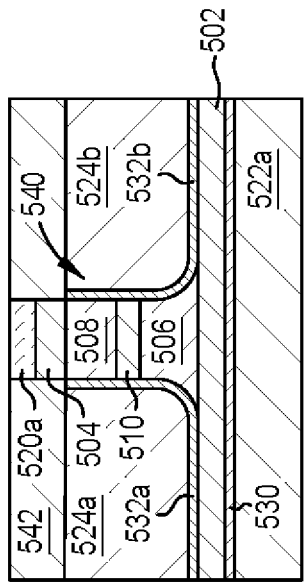
Figure 5F:
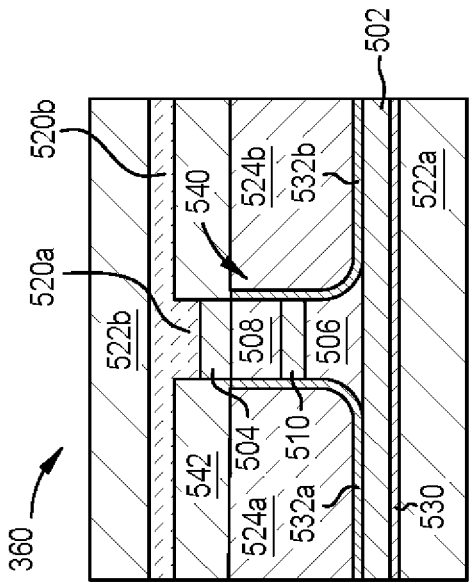

In FIG. 5E, an AFM/capping layer 542 is deposited on the side shield layers 524a, 524b, and around and in contact with the second SHL 504, the second insulation layer 520a, and the photo stencil 534. The AFM/capping layer 542 comprises a material selected from a group of AFM materials that includes IrMn, FeMn, PtMn, and other non-magnetic conducting layers. Furthermore, the AFM/capping layer 542 may comprise a group of AFM materials and one or more materials from a group that includes Ta, Ru, or Ti, other non-magnetic, electrically conductive materials and their multilayers. The AFM/capping layer 542 may be formed by well-known deposition methods, such as sputtering. The AFM/capping layer 542 may have a thickness of between about 40 Angstroms to about 150 Angstroms. Additionally, it is to be understood that while IrMn, FeMn, PtMn, Ta, Ru, Ti and their multilayers have been exemplified as the AFM/capping layer 542 materials, other materials are contemplated and the embodiments discussed herein are not limited to IrMn, FeMn, PtMn, Ta, Ru, or Ti or their multilayers for the AFM/capping layer 542. In FIG. 5F, the photo stencil 534 and a portion of the AFM/capping layer 542 in contact with the photo stencil 534 are removed by a process such as CMP assisted liftoff.

Figure 5G:
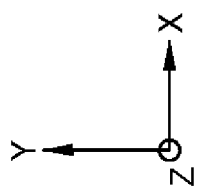
Figure 5G:
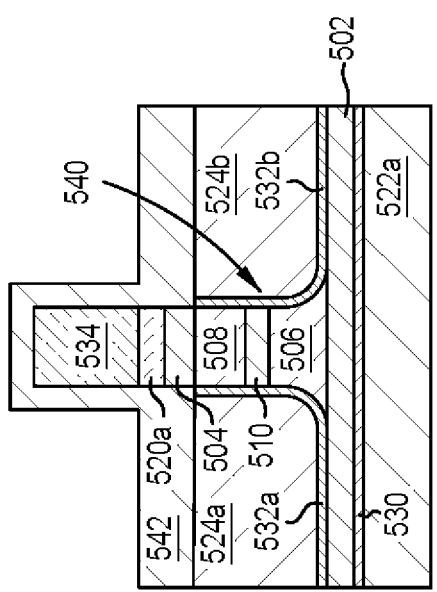
Figure 5H:
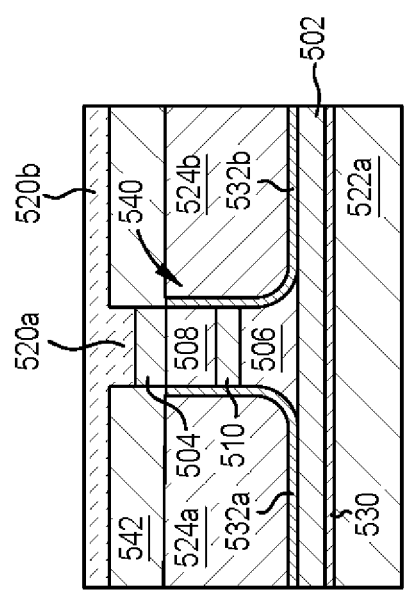

In FIG. 5G, after defining the track-width and the stripe height of the SOT differential reader though the previously discussed steps, a fourth insulation layer 520b is deposited on and in contact with the second insulation layer 520a and AFM/capping layer 542. In FIG. 5H, a second shield 522b is deposited on and in contact with the fourth insulation layer 520b to form a SOT differential reader 360. In one embodiment, the first and second shields 522a, 522b comprise the same or similar materials. In another embodiment, the first and second shields 522a, 522b comprise different materials.

Figure 6E:
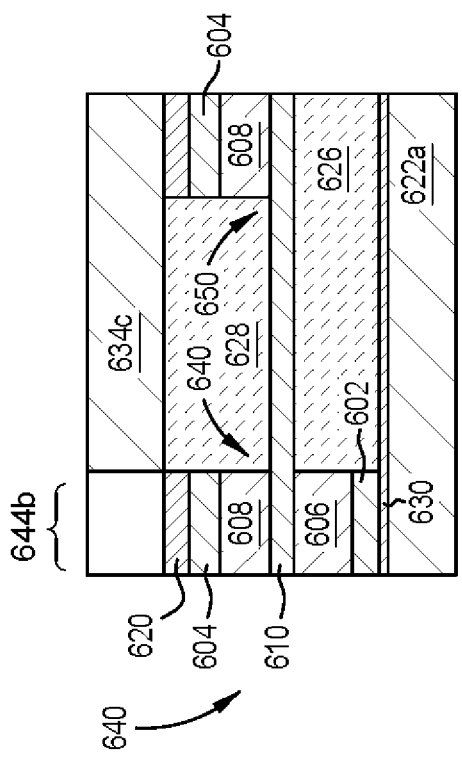

FIGS. 6A-6E illustrate a method of forming and defining a stripe height of the SOT differential reader 370 of FIG. 3D, according to one embodiment. FIGS. 6A-6E illustrate a side cross-sectional view of the SOT differential reader 370. While different reference numerals may be used in FIGS. 6A-6E, the materials of the layers forming the SOT differential reader 370 are the same as the materials described in FIG. 3D above. In FIG. 6A, a first insulation layer 630 is deposited on a first shield 622a, a first SHL 602 is deposited on the first insulation layer 630, a first FL 606 is deposited on the first SHL 602, and a first GL 610a is deposited on the first FL 606 to form a first portion 640a of a stack 640.

In FIG. 6B, a first photoresist or photo stencil 634a is deposited over a portion of the first stack portion 640a on the first GL 610a to define a first stripe height 636a (i.e., in the z-direction) of the first stack portion 640a. The portions of the first GL 610a, the first FL 606, and the first SHL 602 uncovered by the first photo stencil 634a are then removed (i.e., the back end of the first stack portion 640a recessed from the MFS 655) to reveal the first insulation layer 630 disposed over the first shield 622a. In FIG. 6C, a second insulation layer 626 is deposited on a backside surface 641 of the first stack portion 640a (i.e., a surface 641 of the first stack portion 640a recessed from the MFS 655) on the first insulation layer 630, and the first photo stencil 634a is removed. The second insulation layer 626 is deposited to the removed portion of the first stack portion 640a recessed from the MFS 655. The second insulation layer 626 is in contact with the first SHL 602, the first FL 606, and the first GL 610a.

In FIG. 6D, a portion of the second insulation layer 626 aligned with the first GL 610a is removed, and a second GL 610b is deposited on the remaining portion of the second insulation layer 626 adjacent to and in contact to the first GL 610a. The second GL 610b and the first GL 610a form a cohesive GL 610 having a uniform thickness in the y-direction. The GL 610 has a length or width in the z-direction equal to a length or width of the first shield 622a. In some embodiments, the GL 610 includes an electrode to allow for the independent adjustment of the spin hall angle properties of the first SHL 602 and the second SHL 604. A second FL 608 is deposited on the GL 610, a second SHL 604 is deposited on the second FL 608, and a third insulation layer 620 is deposited on the second SHL 604. The second FL 608, the second SHL 604, and the third insulation layer 620 form a second portion 640b of the stack 640. The first stack portion 640a and the second stack portion 640b collectively form the stack 640, which is disposed at the MFS 655.

A second photoresist or photo stencil 634b is deposited on the third insulation layer 620, and a central portion 644a of the second photo stencil 634b is removed, as further shown in FIG. 6D. Central portions 646 of the second stack portion 640b aligned with the removed central portion 644a of the second photo stencil 634b are then etched and removed to define a second stripe height 636b of the second stack portion 640b. The second stripe height 636b is substantially the same as the first stripe height 636a, resulting in the stack 640 having a uniform stripe height 636. The uniform stripe height 636 may be between about 10 nm to about 20 nm. In some embodiments, portions of the GL 610 aligned with the removed central portions 644a, 646 may be removed; however, the majority of the GL 610 is not etched or removed.

Removing the central portions 646 of the second stack portion 640b further forms an electrical lead 650 recessed from the MFS 655 (i.e., the second section 303 of FIG. 3D forms the electrical lead 650). The electrical lead 650 comprises portions of the GL 610, the second FL 608, and the second SHL 604. A portion of the third insulation layer 620 is disposed over the electrical lead 650. The electrical lead 650 is formed in contact with the GL 610, and as such, allows the GL 610 to function as the electrical lead 650. In some embodiments, the electrical lead 650 has a stripe height or width 638 that is greater than the stripe height 636 of the stack 640. The removed central portion 646 has a greater width in the z-direction than the electrical lead 650 and the stack 640.

In FIG. 6E, the second photo stencil 634b is removed, and a fourth insulation layer 628 is disposed in the removed central portion 646 between the second stack portion 640b and the electrical lead 650. The fourth insulation layer 628 is spaced from the second insulation layer 626 by the GL 610. The second insulation layer 626 has a greater width in the z-direction than the fourth insulation layer 628 due to the electrical lead 650. The fourth insulation layer 628 has a greater width in the z-direction than the electrical lead 650 and the stack 640. The second insulation layer 626, the third insulation layer 620, and the fourth insulation layer 628 may comprise the same material.

Figure 6F:
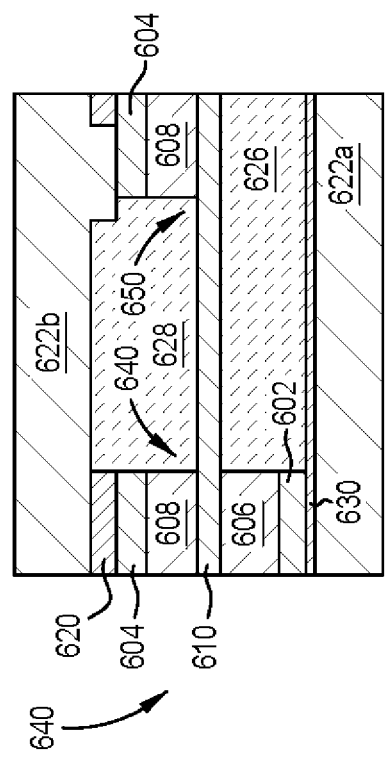

In FIG. 6F, a third photoresist or photo stencil 634c is deposited on the third insulation layer 620 and the fourth insulation layer 628. A second portion 644b of the third photo stencil 634c disposed at the MFS 655 is then removed. The removed second portion 644b of the third photo stencil 634c aligns with the stack 640 and has a width equal to the stack 640 in the z-direction (i.e., a stripe height or width equal to the stripe height 636 of the stack 640). A track-width of the stack 640 in the x-direction may then be defined, such as described above in FIGS. 4B-4H and FIGS. 5B-5H. Once the track-width of the stack 640 is defined, the third photo stencil 634c is removed.

Figure 6G:
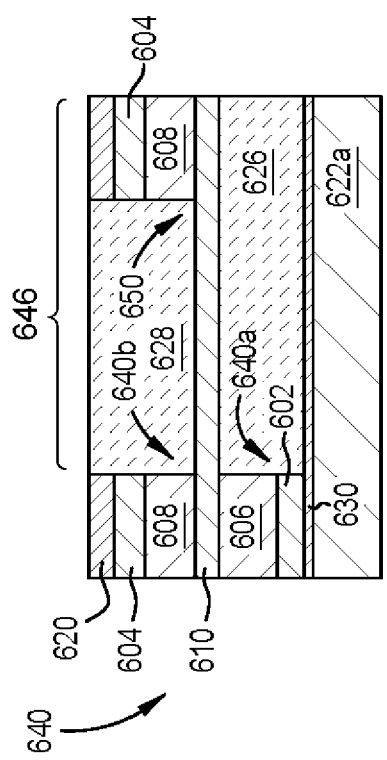

In FIG. 6G, a fourth photoresist or photo stencil 634d is deposited on the third insulation layer 620 and the fourth insulation layer 628. A third portion 644c of the fourth photo stencil 634d at least partially aligned or overlapping with both the electrical lead 650 and the fourth insulation layer 628 is removed. The removed third portion 644c of the fourth photo stencil 634d has a smaller width or size in at least the z-direction than the fourth insulation layer 628. The removed third portion 644c of the fourth photo stencil 634d may have a width in the z-direction less than the width 638 of the electrical lead 650. Portions 648 of the third insulation layer 620 and the fourth insulation layer 628 aligned with the removed third portion 644c of the fourth photo stencil 634d are then etched, such as by an alumina wet etch, and removed to open one or more electrical lead connections. The fourth photo stencil 634d is then removed.

Figure 6H:
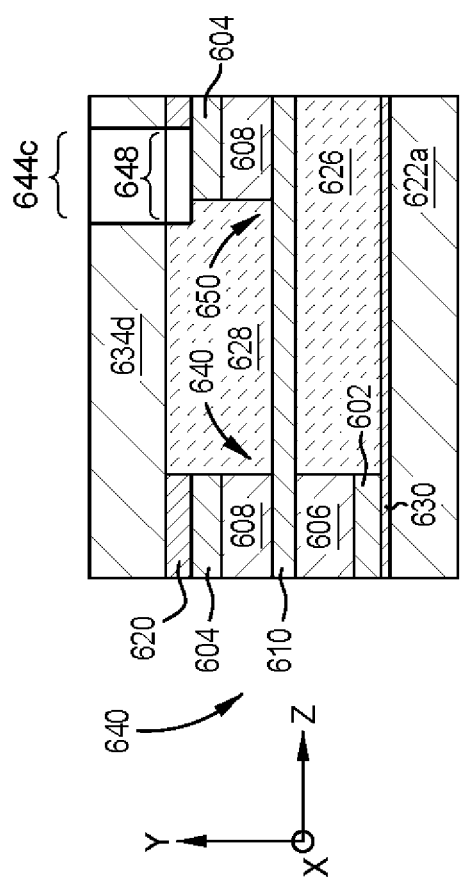

In FIG. 6H, a second shield 622b is deposited on and in contact with the electrical lead 650, the third insulation layer 620, and the fourth insulation layer 628. By removing the portions 648 of the third and fourth insulation layers 620, 628, the second shield 622b is able to contact the electrical lead 650. As such, the second shield 622b may function or serve as an electrical lead connection. The first and second shields 622a, 622b comprise the same material.

By including an electrical lead connection from the gap layer to each of the SHLs of the SOT differential reader, each free layer of the SOT differential reader may be independently adjusted in order to match the magnetic properties of the each free layer. Moreover, a better reader resolution may be achieved while maintaining the shield-to-shield spacing. As such, the shield-to-shield spacing of the shields sandwiching the SOT differential reader need not be reduced to enhance the resolution of the reader, as the SOT differential reader may allow wider shield-to-shield spacing without degrading resolution. By being able to increase the shield-to-shield spacing of the SOT differential reader, the amount of flux can be increased, the free layers may be independently controlled, and the stripe height of the layers of the SOT differential reader may be increased to reduce magnetic noise.

In one embodiment, a magnetic recording head includes a first shield, a second shield, a first bias layer, a second bias layer, and a SOT differential reader disposed between the first shield and the second shield, and between the first bias layer and the second bias layer. The SOT differential reader comprises a first free layer, a second free layer, a gap layer configured to act as a first electrical lead, a first spin hall layer, a second spin hall layer, where the second spin hall layer is in contact with the first bias layer and the second bias layer, and two or more insulation layers comprising a first insulation layer disposed between the first spin hall layer and the first bias layer, and a second insulation layer disposed between the first spin hall layer and the second bias layer. The first and second free layers are configured to be independent controlled.

The first spin hall layer is disposed on the first shield, the first free layer is disposed on the first spin hall layer, the gap layer is disposed on the first free layer, the second free layer is disposed on the gap layer, and the second spin hall layer is disposed on the second free layer. The magnetic recording head is configured to receive current injected into the first spin hall layer and output current through the gap layer, and to receive current injected into the gap layer and output current through the second spin hall layer, wherein a first spin hall effect voltage is induced through the first spin hall layer, and a second spin hall effect voltage is induced through the second spin hall layer. The first spin hall layer comprises a second electrical lead and the second spin hall layer comprises a third electrical lead. A signal output of the second free layer is controlled to match a signal output of the first free layer using one or more of the first, second, and third electrical leads.

An electrode is disposed in contact with the gap layer. The first free layer, the second free layer, the gap layer, the first spin hall layer, and the second spin hall layer are disposed at a media facing surface. The electrode is recessed from the media facing surface. The electrode is further in contact with the second shield. The first spin hall layer has a first track width at the media facing surface and the second spin hall layer has a second track width at the media facing surface less than the first track width. A positive terminal of the first spin hall layer is electrically connected to a negative terminal of the second spin hall layer, and a voltage difference across a negative terminal of the first spin hall layer to a positive terminal of the second spin hall layer is a signal read out of the SOT differential reader.

In another embodiment, a magnetic recording head includes a first shield, a second shield, and a SOT differential reader disposed at a media facing surface between the first shield and the second shield. The SOT differential reader comprises a first free layer, a second free layer, a gap layer configured to act as a first electrical lead, a first spin hall layer, and a second spin hall layer. A positive terminal of the first spin hall layer is electrically connected to a positive terminal of the second spin hall layer. A signal read out of the SOT differential reader is based on a voltage difference across a negative terminal of the first spin hall layer to a negative terminal of the second spin hall layer. The SOT differential reader further comprises an electrical lead is recessed from a media facing surface, the electrical lead being in contact with the gap layer and the second shield, wherein the first free layer, the second free layer, the gap layer, the first spin hall layer, and the second spin hall layer are disposed at the media facing surface.

The first spin hall layer is disposed on the first shield, the first free layer is disposed on the first spin hall layer, the gap layer is disposed on the first free layer, the second free layer is disposed on the gap layer, and the second spin hall layer is disposed on the second free layer. The first spin hall layer has a greater length at the media facing surface than the second spin hall layer. The magnetic recording head is configured to receive a first current injected into the first spin hall layer and output the first current through the gap layer, wherein a first spin hall effect voltage is induced through the first spin hall layer. The magnetic recording head is further configured to receive a second current injected into the gap layer and output the second current through the second spin hall layer, wherein a second spin hall effect voltage is induced through the second spin hall layer. The SOT differential reader further comprises a capping layer, the capping layer being disposed over the second spin hall layer. The magnetic recording head is configured to independently control the first free layer and the second free layer.

The first current and the first spin hall effect voltage produces a first signal output of the first free layer, and the second current and the second spin hall effect voltage produces a second signal output of the second free layer. The first signal output of the first free layer and the second signal output of the second free layer are independently controllable. The SOT differential reader has a stripe height between about 10 nm to about 20 nm.

In another embodiment, a method of forming a SOT differential reader. The method comprises depositing a first free layer over a first shield, a first spin hall layer on the first free layer, and a gap layer on the first spin hall layer to form a first stack, where the first shield has a first width extending from a media facing surface to a surface opposite to the media facing surface, removing portions of the first free layer, the first spin hall layer, and the gap layer to define a first track-width of the first stack, the first track-width of the first stack being less than the first width of the first shield, and depositing a first insulator layer in contact with a first surface of the first stack, the first surface of the first stack being disposed opposite to the media facing surface. The method further comprises depositing a second free layer on the gap layer, a second spin hall layer on the second free layer, and a second insulator layer on the second spin hall layer to form a second stack on the first stack, and removing central portions of the second insulator layer, the second spin hall layer, and the second free layer to define a second track-width of the second stack and to form an electrical lead disposed on the gap layer, wherein the electrical lead is recessed from the media facing surface. A second shield layer is deposited in contact with the electrical lead.

The first track-width is about equal to the second track-width, and wherein the electrical lead is recessed from the media facing surface. The first free layer and the second free layer are independently controlled.

While the foregoing is directed to embodiments of the present disclosure, other and further embodiments of the disclosure may be devised without departing from the basic scope thereof, and the scope thereof is determined by the claims that follow.

What is claimed is:
1. A sensing element, comprising:
   a first bias layer;
   a second bias layer; and
   a spin orbital torque (SOT) differential reader disposed between the first bias layer and the second bias layer, the SOT differential reader comprising:
      a first free layer;
      a second free layer, wherein the first and second free layers are configured to be independently controlled;
      a gap layer configured to act as a first electrical lead;
      a first spin hall layer;
      a second spin hall layer, the second spin hall layer being in contact with the first bias layer and the second bias layer; and
      two or more insulation layers comprising a first insulation layer disposed between the first spin hall layer and the first bias layer, and a second insulation layer disposed between the first spin hall layer and the second bias layer.
2. The sensing element of claim 1, wherein the first spin hall layer is disposed on a first shield, the first free layer is disposed on the first spin hall layer, the gap layer is disposed on the first free layer, the second free layer is disposed on the gap layer, and the second spin hall layer is disposed on the second free layer.

3. The sensing element of claim 1, wherein the sensing element is configured to receive current injected into the first spin hall layer and output current through the gap layer, and to receive current injected into the gap layer and output current through the second spin hall layer, wherein a first spin hall effect voltage is induced through the first spin hall layer, and a second spin hall effect voltage is induced through the second spin hall layer.

4. The sensing element of claim 3, wherein the first spin hall layer comprises a second electrical lead and the second spin hall layer comprises a third electrical lead, and wherein a signal output of the second free layer is controlled to match a signal output of the first free layer using one or more of the first, second, and third electrical leads.

5. The sensing element of claim 1, further comprising an electrode disposed in contact with the gap layer, wherein the first free layer, the second free layer, the gap layer, the first spin hall layer, and the second spin hall layer are disposed at a media facing surface, and wherein the electrode is recessed from the media facing surface.

6. The sensing element of claim 5, wherein the electrode is further in contact with a second shield.

7. The sensing element of claim 5, wherein the first spin hall layer has a first track width at the media facing surface and the second spin hall layer has a second track width at the media facing surface less than the first track width.

8. The sensing element of claim 1, wherein a positive terminal of the first spin hall layer is electrically connected to a negative terminal of the second spin hall layer, and a voltage difference across a negative terminal of the first spin hall layer to a positive terminal of the second spin hall layer is a signal read out of the SOT differential reader.

9. A magnetic recording head comprising the sensing element of claim 1.

10. A sensing element, comprising:
a spin orbital torque (SOT) differential reader disposed at a media facing surface, the SOT differential reader comprising:
a first free layer;
a second free layer;
a gap layer;
a first spin hall layer;
a second spin hall layer, a positive terminal of the first spin hall layer being electrically connected to a positive terminal of the second spin hall layer, wherein a signal read out of the SOT differential reader is based on a voltage difference across a negative terminal of the first spin hall layer to a negative terminal of the second spin hall layer; and
an electrical lead recessed from the media facing surface, the electrical lead being in contact with the gap layer, wherein the first free layer, the second free layer, the gap layer, the first spin hall layer, and the second spin hall layer are disposed at the media facing surface.

11. The sensing element of claim 10, wherein the first spin hall layer is disposed on a first shield, the first free layer is disposed on the first spin hall layer, the gap layer is disposed on the first free layer, the second free layer is disposed on the gap layer, and the second spin hall layer is disposed on the second free layer, wherein the first spin hall layer has a greater length at the media facing surface than the second spin hall layer, and wherein the electrical lead is further in contact with a second shield.

12. The sensing element of claim 11, further comprising a capping layer, the capping layer being disposed over the second spin hall layer.

13. The sensing element of claim 10, wherein the sensing element is configured to:
receive a first current injected into the first spin hall layer;
output the first current through the gap layer, wherein a first spin hall effect voltage is induced through the first spin hall layer;
receive a second current injected into the gap layer; and
output the second current through the second spin hall layer, wherein a second spin hall effect voltage is induced through the second spin hall layer.

14. The sensing element of claim 13, wherein the first current and the first spin hall effect voltage produces a first signal output of the first free layer, and the second current and the second spin hall effect voltage produces a second signal output of the second free layer.

15. The sensing element of claim 14, wherein the first signal output of the first free layer and the second signal output of the second free layer are independently controllable.

16. The sensing element of claim 10, wherein the SOT differential reader has a stripe height between about 10 nm to about 20 nm.

17. A magnetic recording head comprising the sensing element of claim 10.

18. A method of forming a spin orbital torque (SOT) differential reader, comprising:
depositing a first spin hall layer over a first shield, a first free layer on the first spin hall layer, and a gap layer on the first free layer to form a first stack, wherein the first shield has a first width extending from a media facing surface to a surface opposite to the media facing surface;
removing portions of the first free layer, the first spin hall layer, and the gap layer to define a first track-width of the first stack, the first track-width of the first stack being less than the first width of the first shield;
depositing a first insulator layer in contact with a first surface of the first stack, the first surface of the first stack being disposed opposite to the media facing surface;
depositing a second free layer on the gap layer, a second spin hall layer on the second free layer, and a second insulator layer on the second spin hall layer to form a second stack on the first stack;
removing central portions of the second insulator layer, the second spin hall layer, and the second free layer to define a second track-width of the second stack and to form an electrical lead disposed on the gap layer, wherein the electrical lead is recessed from the media facing surface; and
depositing a second shield layer in contact with the electrical lead.

19. The method of claim 18, wherein the first track-width is about equal to the second track-width, and wherein the first free layer and the second free layer are independently controlled.

20. A magnetic recording device comprising the SOT differential reader formed by the method of claim 18.

* * * * *